United States Patent
Powell, Jr. et al.

(10) Patent No.: US 11,638,371 B2
(45) Date of Patent: Apr. 25, 2023

(54) FERRITE SHIELD LOCATED INTERMEDIATE A WIRELESS POWER TRANSMITTER AND RECEIVER AND METHOD OF USING SAME

(71) Applicant: Aptiv Technologies Limited, St. Michael (BB)

(72) Inventors: George Powell, Jr., Cortland, OH (US); James Cook, Poland, OH (US)

(73) Assignee: APTIV TECHNOLOGIES LIMITED, St. Michael (BB)

(*) Notice: Subject to any disclaimer, the term of this patent is extended or adjusted under 35 U.S.C. 154(b) by 0 days.

(21) Appl. No.: 17/732,441

(22) Filed: Apr. 28, 2022

(65) Prior Publication Data

US 2022/0354033 A1    Nov. 3, 2022

Related U.S. Application Data

(60) Provisional application No. 63/181,938, filed on Apr. 29, 2021.

(51) Int. Cl.
| | |
|---|---|
| *H05K 9/00* | (2006.01) |
| *H02J 50/70* | (2016.01) |
| *H02J 50/10* | (2016.01) |
| *H02J 50/00* | (2016.01) |

(52) U.S. Cl.
CPC .......... *H05K 9/0088* (2013.01); *H02J 50/005* (2020.01); *H02J 50/10* (2016.02); *H02J 50/70* (2016.02)

(58) Field of Classification Search
CPC ............................... H05K 9/0088; H02J 50/70
See application file for complete search history.

(56) References Cited

U.S. PATENT DOCUMENTS

| | | | |
|---|---|---|---|
| 2012/0086394 A1* | 4/2012 | Hui | H02J 7/0042 320/108 |
| 2017/0098958 A1* | 4/2017 | Yio | H01F 38/14 |
| 2019/0388028 A1* | 12/2019 | Kim | A61B 5/024 |

* cited by examiner

*Primary Examiner* — Hung V Ngo
(74) *Attorney, Agent, or Firm* — Billion & Armitage

(57) ABSTRACT

An adapter device is configured to interface between a wireless power receiver that includes a first array of magnets arranged around a receiver coil in the wireless power receiver and a wireless power transmitter lacking a corresponding array of magnets arranged around a source coil in the wireless power transmitter. The adapter device includes a substrate and a ferrite shield formed of a magnetic material and configured to be placed between the wireless power receiver and the wireless power transmitter.

14 Claims, 2 Drawing Sheets

FERRITE SHIELD LOCATED INTERMEDIATE A WIRELESS POWER TRANSMITTER AND RECEIVER AND METHOD OF USING SAME

CROSS REFERENCE TO RELATED APPLICATION(S)

This patent application claims the benefit of U.S. Provisional Application No. 63/181,938, filed Apr. 29, 2021 which is incorporated by reference in its entirety.

TECHNICAL FIELD OF THE INVENTION

The invention generally relates to a wireless power transmission system for charging batteries in a consumer electronic device, particularly to a ferrite shield located intermediate a wireless power transmitter and a wireless power receiver of the wireless power transmission system.

BACKGROUND

Wireless power transmission systems, such as the MagSafe® wireless power transmission system developed by Apple, Inc. of Cupertino, Calif., uses an array of magnets in the wireless power transmitter of a charging device that interface with a corresponding array of magnets in the wireless power receiver housed within a consumer electronic device. The magnets in the transmitter and the receiver have compatible polarizations that cause the receiver to be properly aligned with the transmitter and provide physical retention of the receiver to the transmitter. This provides optimal alignment between a receiver coil in the receiver and a source coil in the transmitter, thereby allowing a maximum power transmission between the transmitter and the receiver.

The array of magnets in the receiver may cause undesirable heating of the receiver if used with an alternative transmitter that lacks the array of magnets and has a source coil that is larger than the receiver coil. This heating is due to friendly metal losses in the magnets and other unshielded components in the receiver or consumer electronic device containing the receiver being located within the magnetic field generated by the source coil.

SUMMARY OF THE INVENTION

According to some aspects, an adapter device configured to interface a wireless power receiver that includes a first array of magnets arranged around a receiver coil in the wireless power receiver with a wireless power transmitter lacking a corresponding array of magnets arranged around a source coil in the wireless power transmitter. The adapter device includes a substrate and a ferrite shield formed of a magnetic material and configured to be placed between the wireless power receiver and the wireless power transmitter.

According to another aspect, a method of interfacing a wireless power receiver having a first array of magnets arranged around a receiver coil in the wireless power receiver with a wireless power transmitter lacking a corresponding array of magnets arranged around a source coil in the wireless power transmitter includes providing the wireless power transmitter and providing the wireless power receiver. The method further includes providing an adapter device having a planar substrate and a ferrite shield embedded within the planar substrate between the wireless power receiver and the wireless power transmitter.

According to another aspect, a wireless power charging device includes a wireless power transmitter and an adapter device that interfaces with the wireless power transmitter. The wireless power transmitter includes a plurality of source coils. The adapter device includes a substrate and a ferrite shield embedded in the substrate, the ferrite shield is positioned to overlap with at least some of the plurality of source coils.

BRIEF DESCRIPTION OF THE DRAWINGS

The present invention will now be described, by way of example with reference to the accompanying drawings, in which.

DETAILED DESCRIPTION

This disclosure is directed towards issues arising when a wireless power receiver having a first configuration type is utilized with a wireless power transmitter having a second configuration type. For example, the problem of a wireless power receiver having an array of magnets arranged around a receiver coil in the wireless power receiver overheating and/or experiencing a reduced energy transfer when used with a wireless power transmitter lacking a corresponding array of magnets arranged around a source coil in the wireless power transmitter may be solved by placing a ferrite shield near the interface between the transmitter and receiver.

Figure 1:
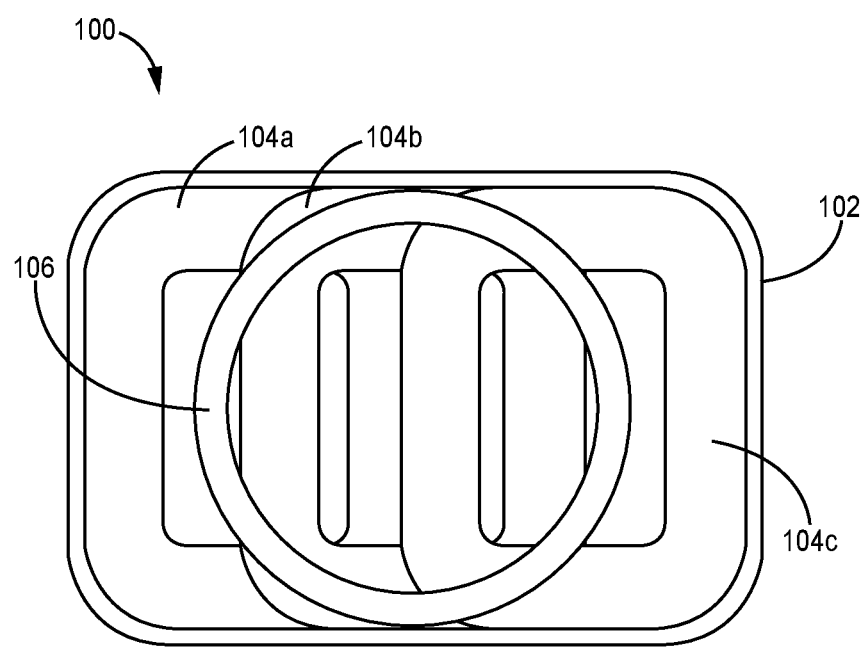
FIG. 1 is a schematic top view of a source coil of a wireless power transmitter and a ferrite shield placed over the source coil in accordance with some embodiments.

Standard wireless power transmitters 100 are designed to provide a large charging area to compensate for imprecise alignment between a source coil or coils 104 in the transmitter 100 and a receiver coil in a receiver. As shown in FIG. 1, these transmitters 100 typically include a magnetic shield 102 usually made of ferrite or other material with similar electromagnetic characteristics and one or more copper Litz wire source coils 104. For example, in the embodiment shown in FIG. 1, the transmitter 100 includes the magnetic shield 102 and one or more source coils 104a, 104b, and 104c (collectively source coils 104) that generate magnetic fields for transmitting power wirelessly to the receiver coil (not shown) located in the wireless power receiver (not shown). The surface area associated with the plurality of source coils 104 ensure that the receiver coil is positioned to receive charging power despite some misalignment between the wireless power transmitter 100 and the wireless power receiver. In some cases, however, the wireless power receiver includes an array of magnets utilized to interact with an array of complimentary magnets located in the wireless power transmitter to ensure alignment between the wireless power receiver and the wireless power transmitter. In this case, the large surface area associated with the source coils 104 and the magnetic fields resulting from the source coils 104 will cause heating in the receiver due to eddy current losses in the magnets and other unshielded components in the receiver. In some embodiments, an adapter device is provided between the transmitter 100 and the receiver (not shown) to prevent the magnetic fields resulting from the source coils 104 from causing unnecessary interference and heating in wireless power receivers having an array of magnets otherwise utilized to provide alignment with a wireless power transmitter having a corresponding array of magnets for alignment purposes.

As shown in FIG. 1, a ferrite shield or ring 106 is added near a surface where the transmitter 100 interfaces with the receiver such that the ferrite shield 106 is positioned between the source coils 104 and the receiver (not shown) when the receiver is placed on or near the transmitter 100 for charging. The ferrite shield 106 shunts or directs the magnetic field produced by the source coil(s) 104 into areas near the array of magnets in the receiver where there is no receiver shielding to minimize eddy current losses. In some embodiments, the ferrite shield 106 at least partially overlaps with one or more of the source coils 104. For example, in the embodiment shown in FIG. 1 the ferrite shield 106 overlaps or partially covers source coils 104a and 104c, thereby shunting or directing the magnetic field produced by the source coils 104a and 104c to prevent eddy current losses in the array of magnets associated with the receiver (not shown). In some embodiments, the ferrite shield 106 is positioned to allow the magnetic field from the source coil 104b to be directed as normal into the receiver. In some embodiments, the ferrite shield 106 is included as part of the transmitter 100. In other embodiments, the ferrite shield 106 is included as part of an adapter device 110 (shown in FIG. 2) that can be selectively attached to either the transmitter 100 or the receiver (not shown) to provide the desired shielding effect.

Figure 2:
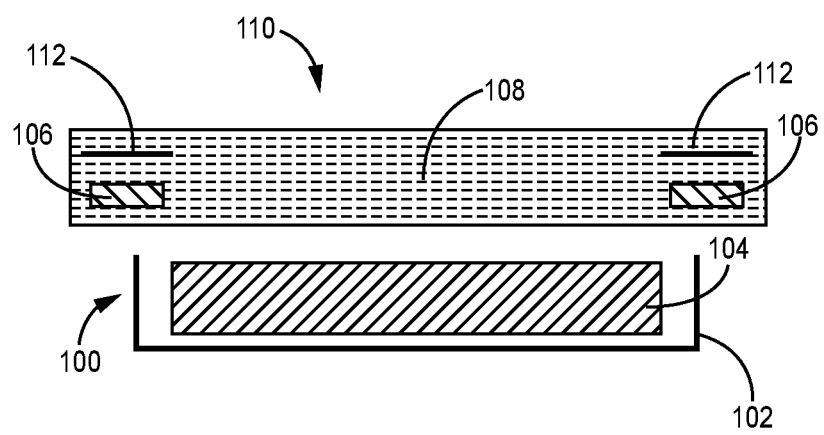
FIG. 2 is a schematic cross-section view of an adapter device containing the ferrite shield of FIG. 1 and the source coil of FIG. 1 in accordance with some embodiments.

FIG. 2 is a cross-sectional view of the transmitter 100 and adapter device 110 according to some embodiments. The transmitter 100 includes one or more source coils 104 and the magnetic shield 102 surrounding the source coils 104. In the embodiment shown in FIG. 2, the adapter device 110 includes the ferrite shield 106, a substrate 108, and a magnetic shield 112. In other embodiments, the adapter device 110 may utilize only the ferrite shield 106. As shown in the cross-sectional view, both the ferrite shield 106 and the magnetic shield 112 are encased in the substrate 108, and the substrate 108 is a planar substrate formed of a dielectric material. As shown in FIG. 1, the ferrite shield 106 may be annular and may overlap with or cover one or more of the source coils 104, while leaving one of the source coils 104 to interact normally with the receiver (not shown). In some embodiments, the magnetic shield 112 is positioned proximate to the ferrite shield 106. For example, the magnetic shield 112 may be positioned coaxially with the ferrite shield 106. In some embodiments, the magnetic shield 112 is positioned in the substrate 108 such that the magnetic shield 112 is interposed between the ferrite shield 106 and the array of magnets in the wireless power receiver (not shown) when the receiver is placed on or near the transmitter 100.

The adapter device 110 may be configured as a cover or a case that is attached to the receiver (not shown). In other embodiments, the adapter device 110 may be configured as a cover or case that is attached to the transmitter 100.

In this way, the ferrite shield 106 in the adapter device 110 shunts or directs the magnetic field produced by the source coil(s) 104 into areas near the array of magnets in the receiver where there is no receiver shielding to minimize eddy current losses. The ferrite shield 106 may also provide a small magnetic attraction with the array of magnets in the receiver. This attractive force is likely less than the attractive force created by transmitters that use an array of magnets to achieve alignment with the receiver, but the attractive force may still be sufficient to guide and maintain sufficient alignment between the source coil and receiver coil when used in horizontal applications. The adapter device 110 may also include an orienting magnet (not shown) embedded in the substrate 108 that can interface with a corresponding orienting magnet in the receiver to help align the receiver on the transmitter.

In some embodiments, the adapter device 110 is attached to a consumer electronic device, such as a mobile phone so that an optimal alignment between the ferrite shield 106, the magnetic shield 112, and the receiver coil of the wireless power receiver in the consumer electronic device may be maintained. The adapter device 110 provides a simple and inexpensive way to allow a wireless power transmitter 100 that lacks an array of magnets around the source coil 104 to interface with a receiver (not shown) having an array of magnets arranged around a receiver coil (not shown). The ferrite ring 106 has a negligible effect on wireless power transmission when used with a receiver that lacks an array of magnets around the receiver coil.

Applicability of the adapter device 110 is not exclusive to use with wireless power receivers having an array of magnets but may also be used to improve charging performance with any wireless power receiver which does not contain enough high permeability, low conductivity shielding material (e.g., ferrite, nanocrystalline) to fully shield the conductive parts of the receiver (i.e., friendly metals; e.g., battery, metal brackets, PCB) from the magnetic field that is generated by the wireless power transmitter. The adapter device 110 is particularly useful when the wireless power transmitter utilizes source coils covering a larger area than the receiver coils in the wireless power receiver.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

We claim:

1. An adapter device configured to interface with a wireless power transmitter having a first magnetic shield surrounding a source coil, the adapter device comprising:
    a substrate; and
    a ferrite shield formed of a magnetic material; and
    a second magnetic shield embedded in the substrate in a location proximate to the ferrite shield and arranged coaxially with the ferrite shield.

2. The adapter device according to claim 1, wherein the substrate is a planar substrate formed of a dielectric material.

3. The adapter device of claim 1, wherein the ferrite shield at least partially overlaps with the source coil.

4. The adapter device according to claim 1, wherein the ferrite shield has an annular shape.

5. The adapter device according to claim 1, wherein the second magnetic shield extends laterally beyond the first magnetic shield.

6. A method of interfacing with a wireless power transmitter having a first magnetic shield surrounding a source coil, comprising:
    providing an adapter device having a planar substrate, a ferrite shield embedded within the planar substrate, and a second magnetic shield embedded within the planar substrate;
    locating the second magnetic shield proximate to the ferrite shield; and
    arranging the second magnetic shield coaxially with the ferrite shield.

7. The method according to claim 6, wherein the planar substrate is formed of a dielectric material.

8. The method according to claim 7, further comprising attaching the adapter device to the wireless power transmitter.

9. The method according to claim 6, wherein the ferrite shield has an annular shape.

10. The method according to claim 6, wherein the second magnetic shield extends laterally beyond the first magnetic shield.

11. A wireless power charging device comprising:
    a wireless power transmitter having a first magnetic shield surrounding a plurality of source coils; and
    an adapter device to interface with the wireless power transmitter, the adapter device comprising:
        a substrate; and
        a ferrite shield embedded in the substrate, the ferrite shield positioned to overlap with at least some of the plurality of source coils; and
        a second magnetic shield embedded in the substrate in a location proximate to the ferrite shield and arranged coaxially with the ferrite shield.

12. The wireless power charging device of claim 11, wherein the substrate is a planar substrate formed of a dielectric material.

13. The wireless power charging device of claim 11, wherein the ferrite shield has an annular shape.

14. The wireless power charging device of claim 11, wherein the second magnetic shield extends laterally beyond the first magnetic shield.

* * * * *